(12) United States Patent
Bogner

(10) Patent No.: US 7,304,598 B1
(45) Date of Patent: Dec. 4, 2007

(54) SHARED AMPLIFIER CIRCUIT

(75) Inventor: Peter Bogner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/468,507

(22) Filed: Aug. 30, 2006

(51) Int. Cl.
*H03M 1/66* (2006.01)

(52) U.S. Cl. ...................... 341/161; 341/156
(58) Field of Classification Search ................ 341/156, 341/161, 162, 163
See application file for complete search history.

(56) References Cited

U.S. PATENT DOCUMENTS

| | | | |
|---|---|---|---|
| 6,965,258 B2 | 11/2005 | Bogner | 327/94 |
| 7,026,968 B1 | 4/2006 | Ali | 341/120 |
| 7,088,278 B2 * | 8/2006 | Kurose et al. | 341/161 |
| 2003/0146786 A1 | 8/2003 | Gulati et a. | 330/9 |
| 2004/0046605 A1 * | 3/2004 | Granville | 330/9 |
| 2004/0150544 A1 * | 8/2004 | Mulder | 341/156 |
| 2005/0104762 A1 * | 5/2005 | Dias | 341/161 |

\* cited by examiner

*Primary Examiner*—Howard L. Williams
(74) *Attorney, Agent, or Firm*—Slater & Matsil, L.L.P.

(57) ABSTRACT

A circuit has a first amplifier having first positive and negative inputs and a second amplifier having second positive and negative inputs. A first unit is connectable to the first and second inputs of the amplifiers and a second unit is connectable to the first and second inputs of the amplifiers. In a first phase, the first unit is connected to the amplifiers, wherein the positive input of the first amplifier is coupled to the positive input of the second amplifier and the negative input of the first amplifier is coupled to the negative input of the second amplifier. In a second phase, the second unit is connected to the amplifiers, wherein the positive input of the first amplifier is coupled to the negative input of the second amplifier and the negative input of the first amplifier is coupled to the positive input of the second amplifier.

18 Claims, 4 Drawing Sheets first phase second phase

SHARED AMPLIFIER CIRCUIT

TECHNICAL FIELD

The invention relates to electronic circuits and, more particularly, to integrated shared amplifier circuits.

BACKGROUND

In some integrated circuits, for example pipeline ADCs (analog-to-digital converters), operational amplifiers (opamps) are used and shared by a plurality of the device units operating in time delayed phases. Opamp sharing saves opamp power and die area, since a shared opamp is used by several device units.

Opamp sharing may introduce additional parasitic capacitances between the device units associated to the shared opamp owing to enhanced routing. Further, the technique of opamp sharing may cause intersymbol interference. This unwanted effect is caused by input and parasitic capacitances of the opamp resulting in that residual charge from a previous sampling phase may still be present in the actual sampling phase in which the opamp is used by another device unit.

As the main contribution to such residual charge comes from the input capacitance of the opamp, intersymbol interference can be minimized by using an opamp with a small input capacitance. However, for some applications, for instance analog-to-digital conversion in a pipeline ADC, high input capacitances occur when high sampling rates are aspired. Therefore, opamp sharing techniques are typically applied only to moderate sampling rates.

SUMMARY

A shared amplifier circuit may comprise a first amplifier having positive and negative inputs, a second amplifier having positive and negative inputs, a first unit connectable to the positive and negative inputs of the amplifiers, a second unit connectable to the positive and negative inputs of the amplifiers, and a switching means configured such that in a first phase, the first unit is connected to the amplifiers, wherein the positive input of the first amplifier is coupled to the positive input of the second amplifier and the negative input of the first amplifier is coupled to the negative input of the second amplifier, and in a second phase, the second unit is connected to the amplifiers, wherein the positive input of the first amplifier is coupled to the negative input of the second amplifier and the negative input of the first amplifier is coupled to the positive input of the second amplifier.

BRIEF DESCRIPTION OF THE DRAWINGS

Aspects of the invention are made more evident in the following detailed description of some embodiments when read in conjunction with the attached drawing figures, wherein.

DETAILED DESCRIPTION

It should be understood that in the following description and claims, the terms "coupled" and "connected" may be used to indicate that two elements interact with each other regardless whether they are in direct physical or electrical contact or they are not in direct contact with each other.

Figure 1:
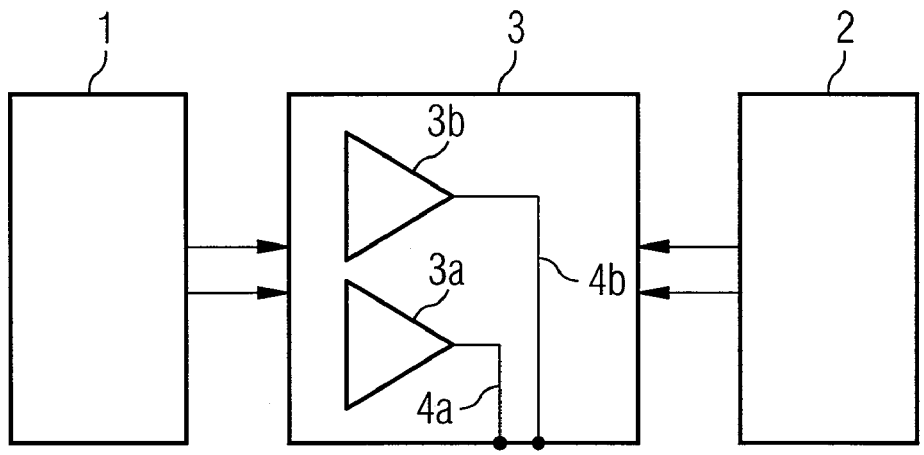
FIG. 1 is a generic block diagram of a shared opamp circuit with two opamps.

FIG. 1 shows an embodiment comprising a first circuit unit 1, a second circuit unit 2 and an opamp stage 3 coupled to the first and second circuit units 1, 2. The opamp stage 3 comprises two opamps 3a. 3b. The opamps 3a, 3b are adapted to co-operate with first circuit unit 1 in a first phase and are adapted to co-operate with second circuit unit 2 in a second phase—i.e. to operate in an alteration mode. Switches (not shown) may be provided to implement the alteration mode operation. Outputs 4a, 4b of the opamp stage 3 may be provided at the opamp stage 3 or may be returned to the respective circuit unit 1, 2 for further processing.

Figure 2:
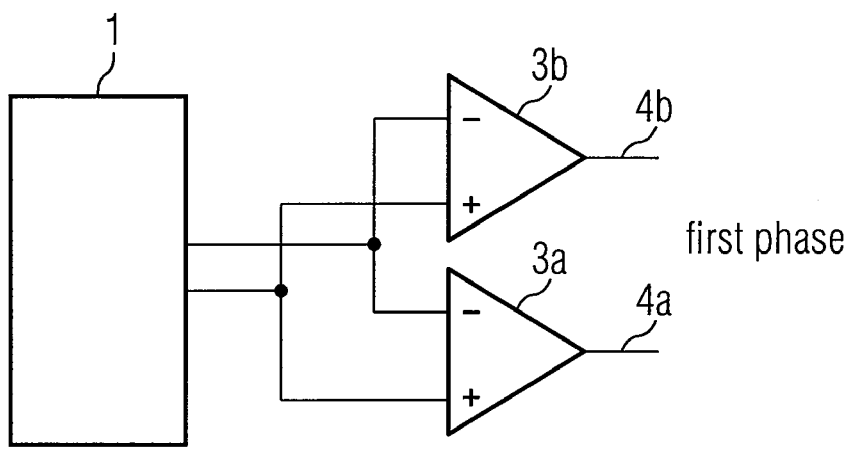
FIG. 2 is a generic block diagram of a shared opamp circuit with two opamps illustrating an alternation mode operation.
Figure 2:
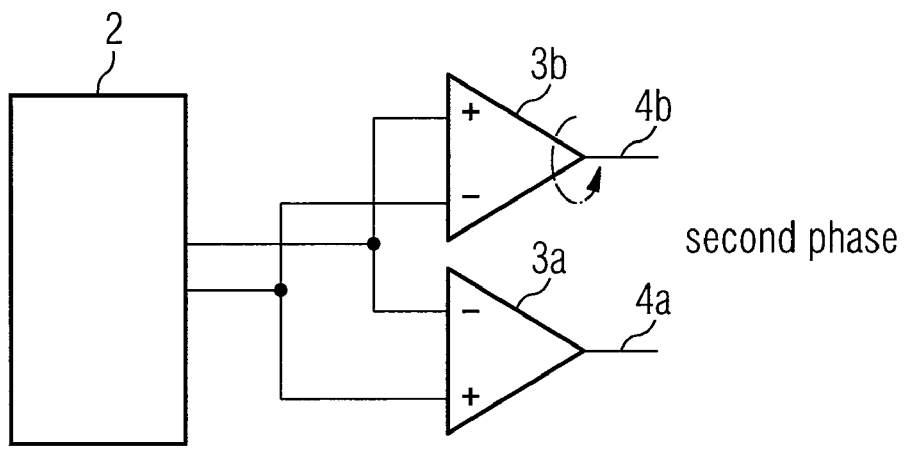

FIG. 2 is a diagram explaining alteration mode operation. In the first phase, the positive inputs of the opamps 3a, 3b are interconnected and the negative inputs of the opamps 3a, 3b are interconnected. Thus, opamps 3a, 3b are operated in parallel.

In the second phase, the positive input of opamp 3a is connected to the negative input of opamp 3b and the negative input of opamp 3a is connected to the positive input of opamp 3b. Thus, opamps 3a, 3b are operated "anti-parallel" or, figuratively speaking, opamp 3b has been turned around. It will be explained in the following that with this architecture, any residual charge at the input nodes of the opamps 3a, 3b is cancelled always for the next phase, excluding the occurrence of intersymbol interference between the operation in the first and second phase.

In the following description, a pipeline ADC, also called subranging quantizer, is used as an exemplary device to incorporate an embodiment and for explanation thereof. However, it should be understood that embodiments may be implemented in many other devices adapted to use the technique of shared opamps. Specifically, all devices which use comparator sharing (i.e. which use a comparator implemented by an opamp operating for different device units) may employ embodiments and are itself embodiments. For instance, subranging flash ADCs use comparator sharing which may be implemented according to the principles outlined herein.

Figure 3:
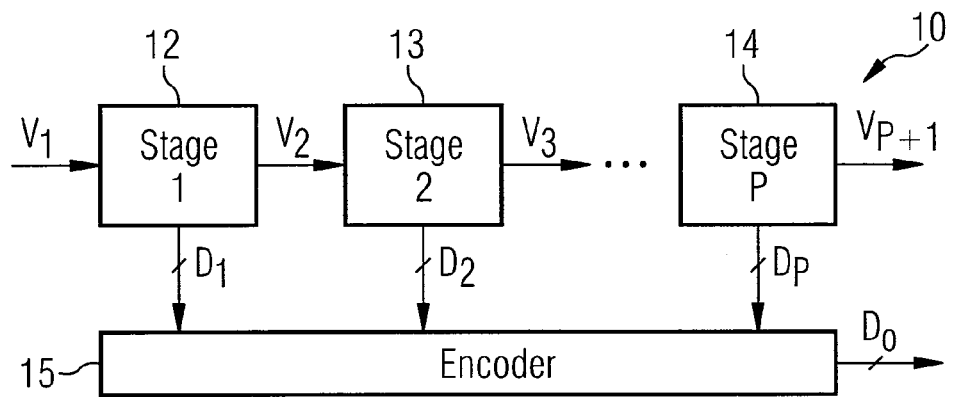
FIG. 3 is a block diagram of a pipeline ADC.

Referring to FIG. 3, a pipeline ADC 10 comprises a cascade of P stages 12, 13, 14. An analog signal $V_1$ is input into the first stage 12. Each stage 12, 13, 14 generates a digital output $D_1, D_2, \ldots,$ DP which is input into an encoder 15. The encoder 15 outputs Do which is the digitized input signal $V_1$.

Figure 4:
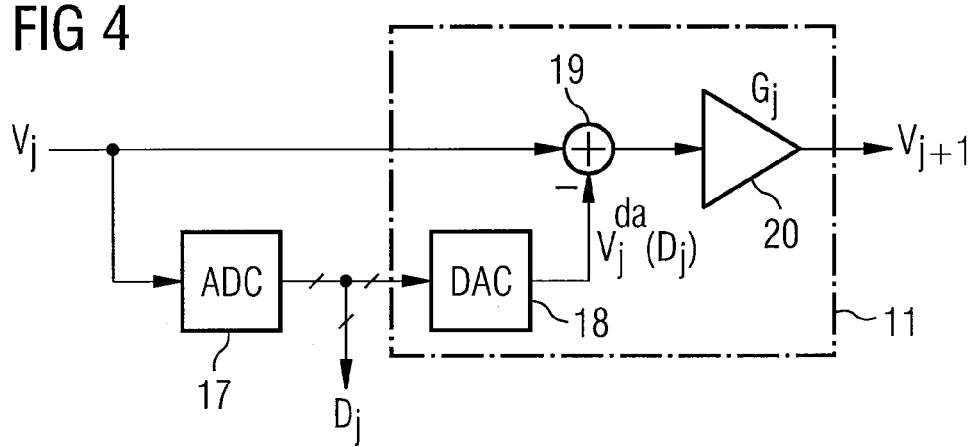
FIG. 4 is a block diagram of a pipeline stage in a pipeline ADC.

FIG. 4 illustrates the structure of stage j, j=1, ..., P. Each stage 12, 13, 14 comprises an internal ADC 17 which quantize the analog input $V_j$. The digital output $D_j$ is a coarse estimation of $V_j$ and drives an internal DAC 18 to generate a corresponding analog signal $V_j^{da}(D_j)$. The analog output $V_{j+1}$ may be expressed by $$V_{j+1} = G_j \times [V_j - V_j^{da}(D_j)] \tag{1}$$

$V_{j+1}$ is the difference between the analog input and the digital estimation $D_j$ thereof multiplied by a gain factor $G_j$. Subtracter 19 and amplifier 20 are used to illustrate the operation outlined in equation (1).

Owing to the amplification in amplifier 20, the circuit 11 comprising DAC 18, subtracter 19 and amplifier 20 is denoted as multiplying digital-to-analog converter (MDAC). In each next stage, $V_{j+1}$, the so called amplified residue, is then converted finer, and the results $D_1$, $D_2$, ..., $D_p$ are combined in the encoder 15.

Figure 5:
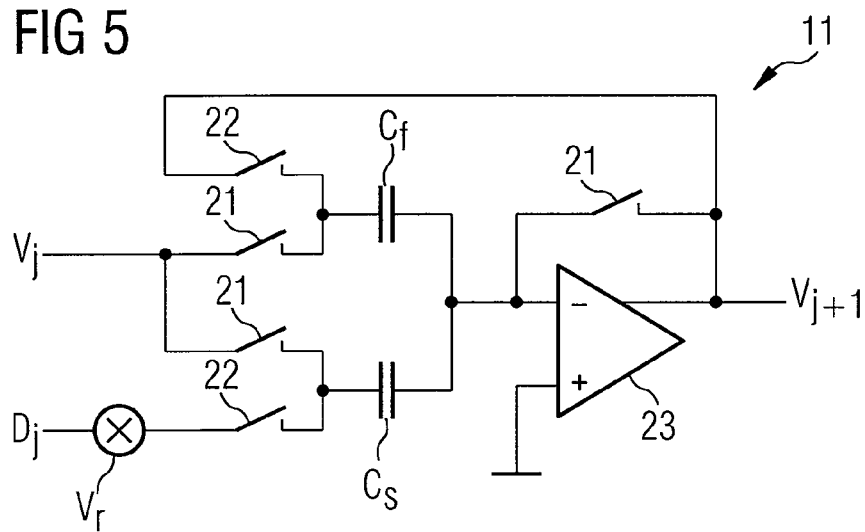
FIG. 5 is a schematic diagram of a switched capacitor multipying DAC using a single opamp.

FIG. 5 illustrates a MDAC 11. In this example, the MDAC 11 comprises first switches 21, second switches 22, an opamp 23 and two capacitances $C_s$ and $C_f$. The digital input $D_j$ from ADC 17 is used to scale a reference voltage $V_r$. During a positive clock phase, switches 21 are closed and switches 22 are open. In this phase, $V_j$ is sampled on capacitors $C_f$ and $C_s$ and $D_j$ is determined in the ADC. For instance, $D_j$ may have the values—1, 0, +1. In the negative clock phase, switches 22 are closed and switches 21 are open. In this phase, the output $V_{j+1}$ is obtained according to $$V_{j+1} = \left(1 + \frac{C_s}{C_f}\right) \times \left[V_j - \frac{C_s}{C_s + C_f} V_r \cdot D_j\right]. \quad (2)$$

If the capacitors are designed so that $C_f = C_s$, comparing equation (1) with equation (2) results in $G_j = 2$ and $V_j^{da}(D_j) = 0.5 \cdot V_r \cdot D_j$.

Basically, the MDAC 11 comprises switched capacitors $C_f$, $C_s$ and an opamp 23. Such type of MDAC is therefore termed SC MDAC (switched capacitor multiplying digital-to-analog converter). It is to be noted that many different implementations could be used to design the switched capacitor array and/or the opamp design in a SC MDAC.

Figure 6:
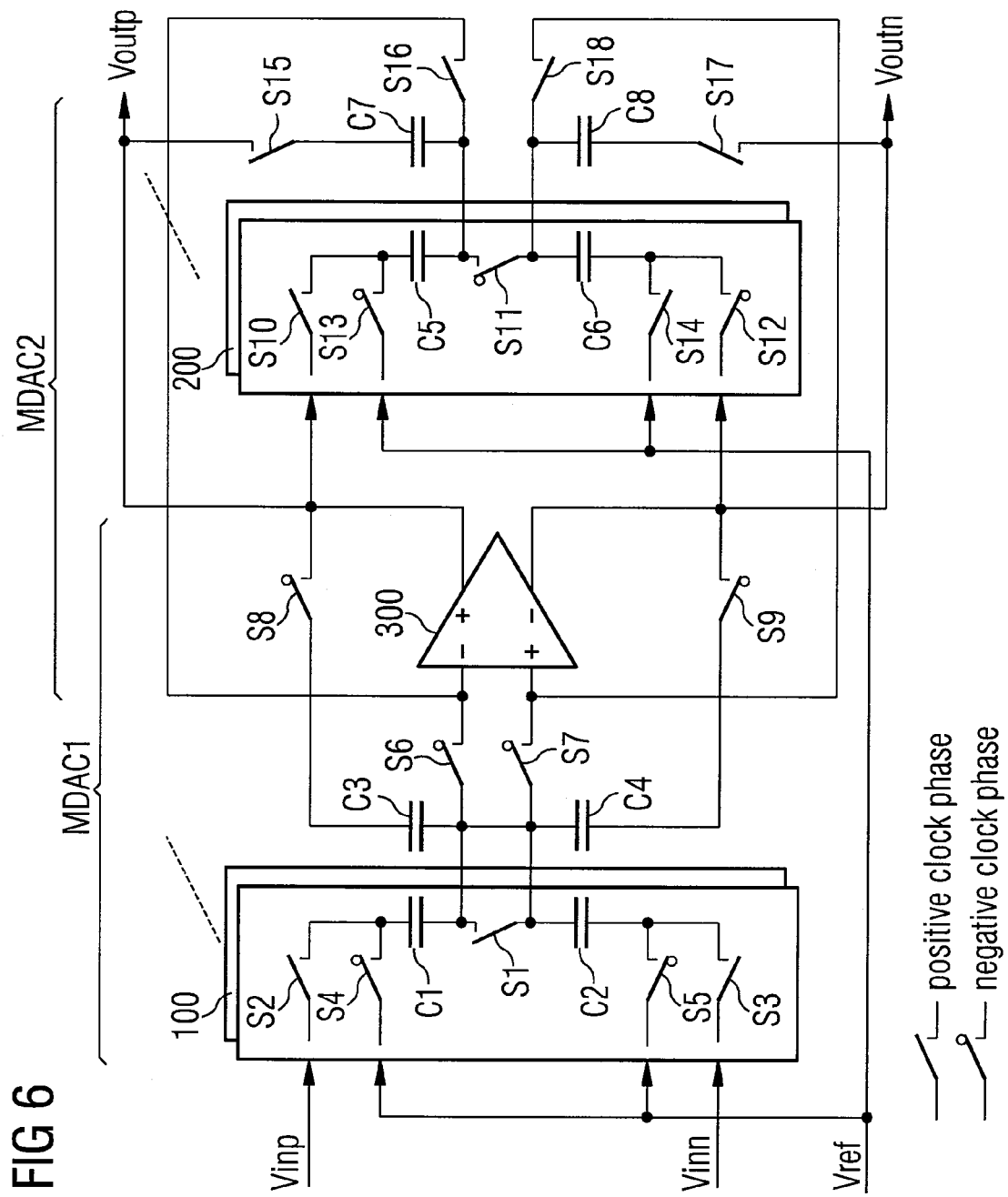
FIG. 6 is a schematic diagram of two switched capacitor multipying DACs using a shared opamp.

In FIGS. 3 to 5, each SC MDAC 11, and thus each stage 12, 13, 14, has its own opamp 23. Shared opamp technique in a pipeline ADC means that two of the stages 12, 13, 14 share one opamp 23. This technique is illustrated in FIG. 6. FIG. 6 illustrates a simplified first switched capacitor unit 100 being part of a first MDAC denoted as MDAC1 and a second switched capacitor unit 200 being part of a second MDAC denoted as MDAC2. MDAC1 and MDAC2 share opamp 300.

More specifically, the first switched capacitor unit 100 comprises storage capacitors C1, C2 connected by a switch S1. The storage capacitor C1 may be connected via switch S2 to the positive input Vinp of MDAC1 and the storage capacitor C2 may be connected via switch S3 to the negative input Vinn of MDAC1. Further, switches S4 and S5 are connected in parallel to switches S2 and S3, respectively, and are operable to connect capacitor C1 and capacitor C2 to a reference voltage Vref.

As suggested by the shadow line and the perspective dashed line, the first switched capacitor unit 100 typically contains an array of switched capacitor circuits each being designed as depicted in FIG. 6.

An output node of storage capacitor C1 is connected via a switch S6 to the negative input of opamp 300 and an output node of capacitor C2 is connected via a switch S7 to the positive input of opamp 300. Further, the output nodes of storage capacitors C1 and C2 are connected to feedback capacitors C3 and C4, respectively. Feedback capacitor C3 may be connected via switches S6 and S8 between the negative input and the positive output of opamp 300, and feedback capacitor C4 may be connected via switches S7 and S9 between the positive input and the negative output of opamp 300. The positive output of (differential) opamp 300 is denoted as Voutp and the negative output of opamp 300 is denoted as Voutn.

The design of the second switched capacitor unit 200 associated to MDAC2 is similar to the design of the first switched capacitor unit 100. Briefly, storage capacitors C5, C6 may be connected in series via switches S10, S11 and S12 to Voutp and Voutn. A feedback capacitor C7 is used to connect Voutp via switches S15, S16 to the negative input of opamp 300 and a feedback capacitor C8 is used to connect Voutn via switches S17, S18 to the positive input of opamp 300.

The circuit in FIG. 6 has a purely differential design. In relation to FIG. 5, Vinp corresponds to $V_j$, Vinn corresponds to $-V_j$, Voutp corresponds to $V_{j+1}$ or $V_{j+2}$ and Voutn corresponds to $-V_{j+1}$ or $-V_{j+2}$. Vref may correspond to $D_j \cdot V_r$. However, typically Vref has a constant value and the digital input $D_j$ provided from the flash ADC 7 is used to steer pairs of reference voltage switches S4, S5 in the capacitor array (cf. shadow line) of the first switched capacitor unit 100 and pairs of reference switches S13, S14 in the capacitor array (shadow line) of the second switched capacitor unit 200.

During a negative clock phase, switches S4, S5, S6, S7, S8, S9, S10, S11, S12 are closed and the residual switches are open. In this phase, the opamp 300 is used to generate the MDAC1 output. Output generation is performed by biasing storage capacitors C1 and C2 at one of their terminals by Vref and connecting the other terminals of storage capacitors C1, C2 to the inputs of the opamp 300. This is the sampling phase of MDAC2, in which serially connected capacitors C5 and C6 are charged by Voutp and Voutn, i.e. by the output of MDAC1. Next, in the positive clock phase, the switches S1, S2, S3, S13, S14, S15, S16, S17, S18 are closed and the residual switches are open. In the positive clock phase, MDAC1 is in the sampling phase and the opamp 300 generates the output of MDAC2. Output generation is performed by biasing serially connected storage capacitors C5 and C6 at the common node by Vref and connecting serially connected storage capacitors C5, C6 to the inputs of the opamp 300.

Assuming an ideal opamp 300 with an infinite open loop gain A0=∞, there would be no voltage difference at the input nodes of the opamp 300. In practice, the opamp 300 has a limited open loop gain A0. Thus, there is a voltage difference between the positive and negative input nodes of the opamp 300 given by (Voutp−Voutn)/A0. This voltage represents a charge Qin at the input nodes of the opamp 300 given by the equation $$\text{Qin} = (\text{Cinput} + \text{Cpar}) \cdot (\text{Voutp} - \text{Voutn})/A0, \quad (3)$$

where Cinput is the input capacitance of the opamp 300 and Cpar are the parasitic capacitances at the opamp input caused by switches and lines. Typically, Qin is dominated by the input capacitance Cinput of the opamp 300, which, in most cases, exceeds the parasitic capacitances Cpar. The charge Qin is then visible during the next clock phase and causes an error when generating the output of the other MDAC. In other words, Qin causes unwanted intersymbol interference.

Figure 7:
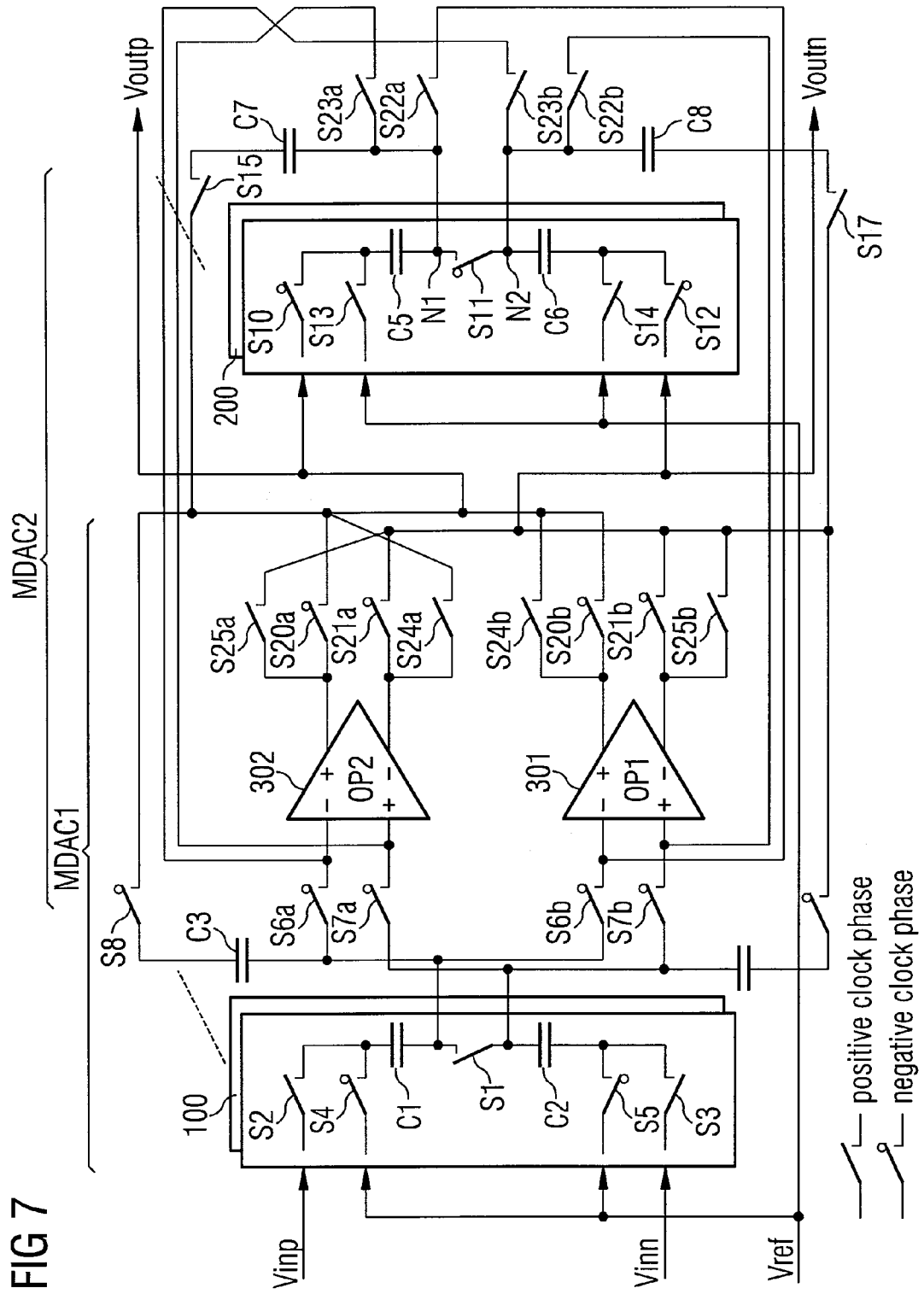
FIG. 7 is a schematic diagram of two switched capacitor multipying DACs using two shared opamps.

FIG. 7 illustrates an embodiment having two SC MDACs using the shared opamp technique. The same or functionally equivalent elements are denoted by the reference signs introduced in FIG. 6. Any description to FIG. 6 referring to elements or properties which are similarly used in the circuit of FIG. 7 are incorporated into the description of the embodiment shown in FIG. 7. Briefly, the first switched capacitor unit 100 and the second switched capacitor unit 200 of the embodiment shown in FIG. 7 may be identical to the units 100, 200 shown in FIG. 6. However, instead of a single opamp 300, two opamps 301 (OP1) and 302 (OP2) are used.

The negative input of opamp 301 is connected via switch S6b to capacitor C1 and the positive input of opamp 301 is connected via switch S7b to capacitor C2 of MDAC1. The negative input of opamp 302 is connected via switch S6a to capacitor C1 and the positive input of opamp 302 is connected via switch S7a to capacitor C2 of MDAC1. Thus, in the negative clock phase, when switches S6a, S6b, S7a, S7b are closed, the negative input of opamp 301 is connected to the negative input of opamp 302 and the positive input of opamp 301 is connected to the positive input of opamp 302. As already described in conjunction with FIG. 6, in the negative clock phase, the output of MDAC1 is generated and storage capacitors C5 and C6 of MDAC2 are charged by Voutp and Voutn.

Charging of serially connected storage capacitors C5 and C6 (switch 11 is closed) is accomplished via switches S20a and S20b, which connect the positive output of opamp 301 with the positive output of opamp 302 and route this signal via closed switch S10 to storage capacitor C5, and via switches S21a and S21b, which connect the negative output of opamp 301 to the negative output of opamp 302 and route this signal via closed switch S12 to storage capacitor C6. Thus, in the negative clock phase, both opamps 301 and 302 work in parallel in view of their input and output connectivity.

In the positive clock phase, as already mentioned, MDAC2 generates the output Voutp and Voutn and the storage capacitors C1, C2 of the first switched capacitor unit 100 sample Vinp, Vinn. More specifically, the capacitors CS and C6 connected in series and common node biased by Vref are connected via closed switches S22a, S22b, S23a, S23b to the inputs of opamps 301 and 302. Routing is accomplished such that the node N1 of storage capacitor CS is connected to the negative input of opamp 301 and to the positive input of opamp 302, whereas the node N2 of storage capacitor C6 is connected to the positive input of opamp 301 and the negative input of opamp 302.

Referring to the output side of opamps 301, 302, the positive output of opamp 301 is connected via switches S24b and S24a to the negative output of opamp 302, and the negative output of opamp 301 is connected via switches S25b and S25a to the positive output of opamp 302. Thus, in the positive clock phase, both the input and the output nodes of one of the opamps (here: opamp 302) are exchanged. In other words, in the negative clock phase, both opamps 301, 302 are operated in parallel, whereas in the positive clock phase, the opamps 301 and 302 are operated "anti-parallel", i.e. with commutated input and output connectivity for one (here: opamp 302) of the opamps 301, 302.

With this architecture, the charge at the input nodes of the opamps 301, 302 is cancelled always for the next clock period. Therefore, no intersymbol interference occurs. This is valid for both clock phases, to the effect that no residual charge is visible for MDAC1 when connecting the storage capacitors C1, C2 to the inputs of opamps 301, 302 in the negative clock phase, and no residual charge is visible for MDAC2 when connecting the storage capacitors C5 and C6 to the (partly reversed) inputs of the opamps 301, 302 in the positive clock phase. Therefore, no additional reset phase for discharging the opamp input circuitry is necessary. Further, high opamp input capacitances can be used and high sampling rates may be achieved.

Importantly, die area and current consumption for two opamps 301, 302 are the same as for the single opamp 300. Thus, the dual opamp implementation may not require any additional expense in view of die area or power consumption compared to the conventional single opamp implementation. The reason for this is that dimensioning of the opamps in view of die area and input current is governed by the noise requirements to be fulfilled. Low noise opamps (which have specifically to be used in the first stage 2 of a pipeline ADC) may require more die area and/or higher input currents. Thus, as in CMOS technology noise inversely scales down with increasing die area and/or increasing current consumption, two opamps of half size and half current consumption virtually fulfill the same noise specifications as a single opamp using the same total area and consuming the same total current. Therefore, the concept of dividing a single opamp 300 into two "half opamps" 301, 302 and allowing them to operate in an alteration mode has no disadvantages in view of opamp implementation.

Further, the invention allows the usage of low gain opamps 301, 302, because the charge Qin, which increases with decreasing gain, is compensated phase-by-phase as a result of the alteration mode technique combined with opamp sharing. The implementation of low gain opamps is beneficial in modern CMOS technologies, because it is difficult to implement high gain opamps.

It is to be noted that the invention is applicable to any circuit using the shared opamp or, more generally speaking, the shared amplifier technique. In all these circuits, instead of one shared amplifier, two shared amplifiers are used and operated in the alteration mode as explained above with reference to the embodiments shown in FIGS. 2 and 7.

What is claimed is:

1. A shared amplifier circuit, comprising:
   a first amplifier having positive and negative inputs,
   a second amplifier having positive and negative inputs,
   a first unit connectable to the positive and negative inputs of the amplifiers,
   a second unit connectable to the positive and negative inputs of the amplifiers,
   a switching means configured such that
   in a first phase, the first unit is connected to the amplifiers, wherein the positive input of the first amplifier is coupled to the positive input of the second amplifier and the negative input of the first amplifier is coupled to the negative input of the second amplifier, and
   in a second phase, the second unit is connected to the amplifiers, wherein the positive input of the first amplifier is coupled to the negative input of the second amplifier and the negative input of the first amplifier is coupled to the positive input of the second amplifier.

2. The shared amplifier circuit according to claim 1, wherein:
   the first amplifier having positive and negative outputs,
   the second amplifier having positive and negative outputs, wherein
   in the first phase, the positive output of the first amplifier is coupled to the positive output of the second amplifier and the negative output of the first amplifier is coupled to the negative output of the second amplifier, and
   in the second phase, the positive output of the first amplifier is coupled to the negative output of the second amplifier and the negative output of the first amplifier is coupled to the positive output of the second amplifier.

3. The shared amplifier circuit according to claim 1, wherein:
the first unit having first and second outputs, wherein the first and second outputs are connectable to the inputs of the amplifiers via first switches of the switching means,
the second unit having first and second outputs, wherein the first and second outputs are connectable to the inputs of the amplifiers via second switches of the switching means, wherein
in the first phase, the first output of the first unit is coupled to the positive inputs of the amplifiers, and the second output of the first unit is coupled to the negative inputs of the amplifiers via closed first switches, and
in the second phase, the first output of the second unit is coupled to the positive input of the first amplifier and to the negative input of the second amplifier, and the second output of the second unit is coupled to the negative input of the first amplifier and to the positive input of the second amplifier via closed second switches.

4. The shared amplifier circuit according to claim 1, wherein:
the first unit comprises a switched capacitor unit of a first SC MDAC (switched capacitor multiplying digital-to-analog converter).

5. The shared amplifier circuit according to claim 1, wherein:
the second unit comprises a switched capacitor unit of a second SC MDAC (switched capacitor multiplying digital-to-analog converter).

6. A pipeline analog-to-digital-converter (ADC), comprising:
a multi stage portion, each stage having an ADC to generate a stage digital output and a switched capacitor multiplying digital-to-analog converter (SC MDAC) coupled to said stage digital output, wherein
the SC MDAC of a first stage comprises a first switched capacitor unit,
the SC MDAC of a second stage comprises a second switched capacitor unit,
the first and second switched capacitor units being connectable to positive and negative inputs of a first amplifier and to positive and negative inputs of a second amplifier, wherein
in a first phase, the first switched capacitor unit is connected to the amplifiers, wherein the positive input of the first amplifier is coupled to the positive input of the second amplifier and the negative input of the first amplifier is coupled to the negative input of the second amplifier, and
in a second phase, the second switched capacitor unit is connected to the amplifiers, wherein the positive input of the first amplifier is coupled to the negative input of the second amplifier and the negative input of the first amplifier is coupled to the positive input of the second amplifier.

7. The pipeline ADC according to claim 6, wherein:
the first amplifier having positive and negative outputs,
the second amplifier having positive and negative outputs,
in the first phase, the positive output of the first amplifier is coupled to the positive output of the second amplifier, and the negative output of the first amplifier is coupled to the negative output of the second amplifier, and
in the second phase, the positive output of the first amplifier is coupled to the negative output of the second amplifier and the negative output of the first amplifier is coupled to the positive output of the second amplifier.

8. The pipeline ADC according to claim 6, wherein:
the first switched capacitor unit having first and second outputs, wherein the first and second outputs are connectable to the inputs of the amplifiers via first switches,
the second switched capacitor unit having first and second outputs, wherein the first and second outputs are connectable to the inputs of the amplifiers via second switches, wherein
in the first phase, the first output of the first switched capacitor unit is coupled to the positive inputs of the amplifiers and the second output of the first switched capacitor unit is coupled to the negative inputs of the amplifiers via closed first switches, and
in the second phase, the first output of the second switched capacitor unit is coupled to the positive input of the first amplifier and to the negative input of the second amplifier and the second output of the second switched capacitor unit is coupled to the negative input of the first amplifier and to the positive input of the second amplifier via closed second switches.

9. A circuit comprising:
two multiplying digital-to-analog converters (MDACS) sharing two amplifiers each having positive and negative inputs, wherein
in a first phase, both amplifiers are coupled to be part of the first MDAC,
in a second phase, both amplifiers are coupled to be part of the second MDAC, and
in the second phase, the coupling of the inputs of one of the amplifiers is commutated with respect to the coupling of the inputs of said amplifier in the first phase.

10. The circuit according to claim 9, wherein:
the two amplifiers each having positive and negative outputs, wherein
in the first phase, the positive outputs and the negative outputs of the amplifiers are coupled, respectively, and
in the second phase, the outputs of said amplifier with commutated inputs are commutated.

11. A method for sharing amplifiers in a circuit, the circuit comprising:
a first amplifier having positive and negative inputs,
a second amplifier having positive and negative inputs,
a first unit connectable to the positive and negative inputs of the amplifiers,
a second unit connectable to the positive and negative inputs of the amplifiers, wherein the method comprises
in a first phase, connecting the first unit to the amplifiers, wherein the positive input of the first amplifier is coupled to the positive input of the second amplifier and the negative input of the first amplifier is coupled to the negative input of the second amplifier, and
in a second phase, connecting the second unit to the amplifiers, wherein the positive input of the first amplifier is coupled to the negative input of the second amplifier and the negative input of the first amplifier is coupled to the positive input of the second amplifier.

12. The method according to claim 11, wherein:
the first amplifier having positive and negative outputs,
the second amplifier having positive and negative outputs,
in the first phase, coupling the positive output of the first amplifier to the positive output of the second amplifier and coupling the negative output of the first amplifier to the negative output of the second amplifier, and in the second phase, coupling the positive output of the first amplifier to the negative output of the second amplifier and coupling the negative output of the first amplifier to the positive output of the second amplifier.

13. The method according to claim 11, wherein:
the first unit having first and second outputs, the first and second outputs are connectable to the positive and negative inputs of the amplifiers via first switches,
the second unit having first and second outputs, the first and second outputs are connectable to the positive and negative inputs of the amplifiers via second switches, wherein the method comprises
in the first phase, closing first switches to couple the first output of the first unit to the positive inputs of the amplifiers, and to couple the second output of the first unit to the negative inputs of the amplifiers, and
in the second phase, closing second switches to couple the first output of the second unit to the positive input of the first amplifier and to the negative input of the second amplifier, and to couple the second output of the second unit to the negative input of the first amplifier and to the positive input of the second amplifier.

14. The method according to claim 11, wherein:
the first unit represents a switched capacitor unit of a first SC MDAC (switched capacitor multiplying digital-to-analog converter).

15. The method according to claim 11, wherein:
the second unit represents a switched capacitor unit of a second SC MDAC (switched capacitor multiplying digital-to-analog converter).

16. A method for analog-to-digital converting an analog signal in a pipeline analog-to-digital-converter (ADC), the pipeline ADC comprises:
a multi stage portion, each stage having an ADC to generate a stage digital output and a SC MDAC (switched capacitor multiplying digital-to-analog converter) coupled to said stage digital output, wherein
the SC MDAC of a first stage comprises a first switched capacitor unit,
the SC MDAC of a second stage comprises a second switched capacitor unit,
the first and second switched capacitor units being connectable to positive and negative inputs of a first amplifier and to positive and negative inputs of a second amplifier, wherein
in a first phase, connecting the first switched capcitor unit to the amplifiers, wherein the positive input of the first amplifier is coupled to the positive input of the second amplifier and the negative input of the first amplifier is coupled to the negative input of the second amplifier, and
in a second phase, connecting the second switched capacitor unit to the amplifiers, wherein the positive input of the first amplifier is coupled to the negative input of the second amplifier and the negative input of the first amplifier is coupled to the positive input of the second amplifier.

17. The method according to claim 16, wherein:
the first amplifier having positive and negative outputs, the second amplifier having positive and negative outputs, and the method comprises
in the first phase, coupling the positive output of the first amplifier to the positive output of the second amplifier, and coupling the negative output of the first amplifier to the negative output of the second amplifier, and
in the second phase, coupling the positive output of the first amplifier to the negative output of the second amplifier and coupling the negative output of the first amplifier to the positive output of the second amplifier.

18. A method for analog-to-digital converting an analog signal in a pipeline analog-to-digital-converter (ADC), the pipeline ADC comprises two multiplying digital-to-analog converters (MDACs) sharing two amplifiers each having positive and negative inputs, wherein the method comprises:
in a first phase, coupling both amplifiers to be part of the first MDAC,
in a second phase, coupling both amplifiers to be part of the second MDAC and commutating the coupling of the inputs of one of the amplifiers with respect to the coupling of the inputs of said amplifier in the first phase.

* * * * *